(12) United States Patent  (10) Patent No.: US 7,813,198 B2
Lin et al.  (45) Date of Patent: Oct. 12, 2010

(54) SYSTEM AND METHOD FOR READING MEMORY

(75) Inventors: Sung-Wei Lin, Spring, TX (US);
Stephen Keith Heinrich-Barna, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 90 days.

(21) Appl. No.: 12/102,125

(22) Filed: Apr. 14, 2008

(65) Prior Publication Data

US 2009/0034338 A1  Feb. 5, 2009

Related U.S. Application Data

(60) Provisional application No. 60/953,331, filed on Aug. 1, 2007.

(51) Int. Cl.
*G11C 7/00*  (2006.01)
(52) U.S. Cl. .................... 365/205; 365/203; 365/206; 365/210
(58) Field of Classification Search ............. 365/205, 365/206, 207, 203, 210
See application file for complete search history.

(56) References Cited

U.S. PATENT DOCUMENTS

| 4,421,996 | A | * | 12/1983 | Chuang et al. ........... 327/57 |
|---|---|---|---|---|
| 4,894,802 | A | | 1/1990 | Hsia et al. |
| 5,528,543 | A | | 6/1996 | Stiegler |
| 5,872,794 | A | | 2/1999 | Cook et al. |
| 6,160,286 | A | | 12/2000 | Chi |
| 7,023,736 | B2 | * | 4/2006 | Cernea et al. .......... 365/185.21 |
| 7,072,216 | B2 | | 7/2006 | Kim |
| 7,139,196 | B2 | | 11/2006 | Tran |
| 7,187,581 | B2 | | 3/2007 | Ferrant et al. |
| 7,277,324 | B2 | | 10/2007 | Tomita |
| 2004/0203503 | A1 | * | 10/2004 | Rollins et al. .............. 455/90.3 |
| 2006/0039199 | A1 | | 2/2006 | Gratz et al. |
| 2007/0171744 | A1 | | 7/2007 | Mokhlesi et al. |
| 2007/0253255 | A1 | | 11/2007 | Gallo et al. |

* cited by examiner

*Primary Examiner*—Son Dinh
(74) *Attorney, Agent, or Firm*—Dawn V. Stephens; Wade James Brady, III; Frederick J. Telecky, Jr.

(57) ABSTRACT

One embodiment of the invention includes a memory system. The system comprises a memory cell coupled to a bit-line node. The memory cell can be configured to generate a bit-line current on the bit-line node in response to a bias voltage during a read operation. The system further comprises a sense amplifier configured to maintain a substantially constant voltage magnitude of the bit-line node during a pre-charge phase and a sense phase of the read operation based on regulating current flow to and from the bit-line node, and to determine a memory value of the flash memory transistor during the read operation based on a magnitude of the bit-line current on the bit-line node.

21 Claims, 6 Drawing Sheets

SYSTEM AND METHOD FOR READING MEMORY

RELATED APPLICATIONS

The present invention claims priority from U.S. Provisional Patent Application No. 60/953,331, filed Aug. 1, 2007, entitled "High Speed Source-Side Current Sensing Sense Amplifier for Flash EEPROM".

TECHNICAL FIELD

This invention relates to electronic circuits, and more specifically to a system and method for reading memory.

BACKGROUND

As the technology of electronic devices improves, so also does the technology of associated electronic memory. Specifically, digital memory devices are implemented in any of a variety of electronic devices, such as wireless communications devices and personal computers, where processing speed is constantly improving. In addition, many such electronic devices operate from battery power. As a result, the demand for memory devices that are more power efficient and achieve faster storage and access times is constantly increasing to improve battery life and to complement increases in operation and processing times of associated electronic devices.

One type of memory is flash memory, which is a type of non-volatile memory that is electronically controlled to store and erase data. Flash memory is typically configured as a flash memory transistor that includes a floating gate, such that writing data to the flash memory transistor can be accomplished via Channel Hot Electron (CHE) programming, and erasing the flash memory transistor can be accomplished via Fowler-Nordheim tunneling effects. Reading data from the flash memory can be accomplished by biasing the flash memory transistor, such that a resultant current flow on an associated bit-line that results from a charge trapped in the floating gate can be indicative of a memory value stored therein.

In a typical memory array of flash memory transistors, a source terminal of all of the flash memory transistors can be coupled together. However, the drain terminals of all of the flash memory transistors can be individually decoded via a column decoder. As an example, to read data from a typical flash memory transistor, a source terminal of the flash memory transistor is held at a negative rail voltage potential (e.g., ground), a gate terminal of the flash memory transistor is biased at approximately 5 volts, and a drain terminal is pre-charged at a bias magnitude of approximately 0.8 volts. In response, a current at the bit-line, which can be coupled to the drain terminal, can provide a current flow that is indicative of the memory value. However, the bit-line that connects the drain terminal of a flash memory transistor for a large memory array can include a substantial parasitic capacitance (e.g., 1 pF), resulting in a substantially slower pre-charge time associated with the bias magnitude at the drain terminal of the flash memory transistor. Accordingly, the access time for reading the memory value from the flash memory transistor can be slow relative to other electronic components in a system that includes a flash memory system.

SUMMARY

One embodiment of the invention includes a memory system. The system comprises a memory cell coupled to a bit-line node. The memory cell can be configured to generate a bit-line current on the bit-line node in response to a bias voltage during a read operation. The system further comprises a sense amplifier configured to maintain a substantially constant voltage magnitude of the bit-line node during a pre-charge phase and a sense phase of the read operation based on regulating current flow to and from the bit-line node, and to determine a memory value of the flash memory transistor during the read operation based on a magnitude of the bit-line current on the bit-line node.

Another embodiment of the invention includes a method for reading a memory cell. The method comprises applying a bias voltage to a gate of the memory cell to generate a bit-line current on a bit-line node and regulating current flow into and out of the bit-line node to maintain a substantially constant voltage at the bit-line node during a pre-charge phase and a sense phase of a read operation of the memory cell. The method further comprises determining a memory value of the memory cell during the sense phase of the read operation based on a magnitude of the bit-line current.

Another embodiment of the invention includes a system for implementing a read operation for reading data from a plurality of memory cells. The system comprises means for pre-charging a sense node and a reference node associated with each of the memory cells and means for applying a bias voltage to each of the memory cells to induce a bit-line current associated with a respective bit-line node of each of the memory cells in response to the applied bias voltage. The system also comprises means for generating a sense current and a reference sense current for each of the memory cells. The reference sense current can have a predetermined magnitude and the sense current can have a magnitude that varies as a function of the respective bit-line current. The system further comprises means for determining a memory value of each of the memory cells based on a relative change in voltage magnitudes of the respective sense node and the respective reference node in response to the relative magnitude between the respective sense current and the respective reference sense current.

DETAILED DESCRIPTION

The invention relates to electronic circuits, and more specifically to a system and method for reading memory. The following description is generally with reference to reading data from a flash memory. However, it is to be understood and appreciated that the description can likewise be applicable to any of a variety of memory system types.

A flash memory transistor can be biased at a common source terminal, with a drain terminal of the flash memory transistor that is provided as a bit-line node being held at a substantially zero volt potential. A sense amplifier that is coupled to the flash memory transistor can provide a current path for a current flow associated with the bit-line node that is coupled to the drain terminal of the flash memory transistor, and can regulate a plurality of currents associated with the bit-line node to maintain a substantially constant voltage (e.g., zero volts) at the bit-line node. One of the plurality of currents can be a sense current and another of the currents can be a reference sense current. The magnitude of the sense current can be based on the current associated with the bit-line node. As a result, the magnitude of the sense current can be compared to the magnitude of the reference sense current for the determination of a memory value associated with the flash memory transistor.

Figure 1:
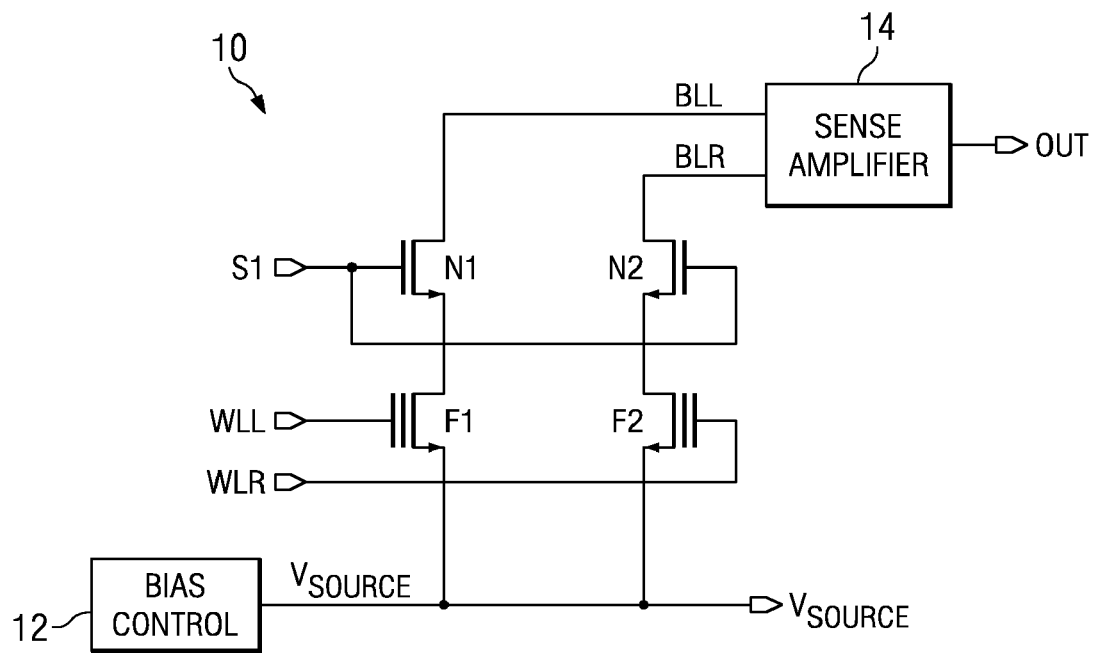
FIG. 1 illustrates an example of a flash memory system in accordance with an aspect of the invention.

FIG. 1 illustrates an example of a memory system 10 in accordance with an aspect of the invention. The memory system 10 is demonstrated in the example of FIG. 1 as a portion of a substantially larger memory system, such as can be configured to store several megabytes or gigabytes of data. The memory system 10 can be included in any of a variety of electronic devices or peripheral devices, such as an external memory component. The following discussion is directed toward reading data from the memory system 10. However, it is to be understood that data can be written to and stored in the memory system 10, and that the data that is stored in the memory system 10 can be erased, similar to a typical flash memory system.

The memory system 10 includes a pair of memory cells, demonstrated in the example of FIG. 1 as a first flash transistor F1 and a second flash transistor F2. Each of the first and second flash transistors F1 and F2 are demonstrated in the example of FIG. 1 as having a floating gate. As an example, the first and second flash transistors F1 and F2 can be included in a flash memory array, such that the first and second flash transistors F1 and F2 can be coupled to a plurality of additional flash memory transistors via respective source terminals.

The first flash transistor F1 has a gate that is coupled to an activation signal WLL, and the second flash transistor F2 has a gate that is coupled to an activation signal WLR. The activation signals WLL and WLR can thus correspond to word-line signals and are thus asserted to provide a sufficient bias voltage to the respective first and second flash transistors F1 and F2 for a read operation. Therefore, upon one of the first and second flash transistors F1 and F2 being activated, a current is induced on a respective one of a first bit-line node BLL and a second bit-line node BLR that corresponds to the memory value of the respective activated one of the first and second flash transistors F1 and F2. It is to be understood that, in the example of FIG. 1 and as demonstrated in greater detail below, a given one of the first and second flash memory transistors F1 and F2 can be activated at a given time for a read operation, with the bit-line of the other of the first and second flash memory transistors F1 and F2 being implemented as a balanced RC load during sensing. As another example, the memory system 10 could be configured to include only a single flash transistor.

The first flash transistor F1 has a drain coupled to a first selection transistor N1 and the second flash transistor F2 has a drain coupled to a second selection transistor N2. The first selection transistor N1 thus interconnects the first flash transistor F1 to a first bit-line node BLL and the second selection transistor N2 interconnects the second flash transistor F2 to a second bit-line node BLR. The first and second selection transistors N1 and N2 are each controlled at a gate by a signal S1, which can be a portion of a code signal that is configured to activate the first and second flash transistors F1 and F2. As an example, the code signal can be a column or row activation signal. In addition, it is to be understood that the memory system 10 can include multiple selection transistors coupled in series between the respective first and second flash transistors F1 and F2 and their respective bit-line nodes, such that multiple signals corresponding to multiple portions of the larger flash memory system can be implemented to activate the first and second flash memory transistors F1 and F2.

Each of the first and second flash transistors F1 and F2 are coupled at a source to a bias controller 12. The bias controller 12 can be configured, upon entering a flash memory read mode, to provide a bias voltage $V_{SOURCE}$ to the sources of the first and second flash transistors F1 and F2, as well as to the sources of the remainder of the flash memory transistors in the flash memory array. As an example, the bias voltage $V_{SOURCE}$ has a magnitude of approximately 0.8 volts. As a result, once the S1 signal is activated and the respective one of the WLL and WLR signals is activated, the respective one of the activated first and second flash transistors F1 and F2 generates a current on the respective one of the bit-lines BLL and BLR. The memory system 10 includes a sense amplifier 14 that is configured to determine the memory value of the respective activated one of the first and second flash transistors F1 and F2 based on the current on the respective bit-line BLL or BLR. Upon determining the memory value, the sense amplifier 14 provides the memory value as an output signal OUT.

In addition, to provide a substantially reduced access time of the memory value, the sense amplifier 14 is configured to maintain a substantially constant voltage (e.g., 0 volts) at the bit-line node during the read operation. For example, the sense amplifier 14 can be configured to regulate a plurality of currents that are added to the current associated with the bit-line node to result in a magnitude sum of zero relative to the bit-line node. As a result, there is substantially no swing in the voltage associated with the bit-line node, such that a pre-charge time associated with the bit-line node is substantially zero. Accordingly, the access time of the memory value of the respective one of the first and second flash transistors F1 and F2 is substantially reduced relative to a typical flash memory system.

Figure 2:
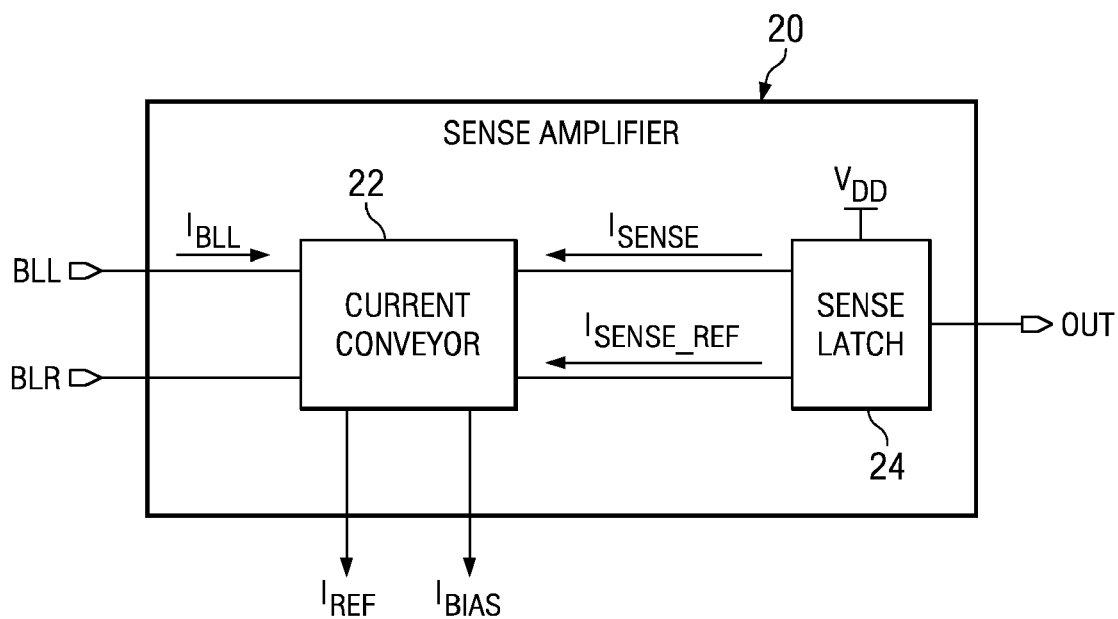
FIG. 2 illustrates an example of a sense amplifier in accordance with an aspect of the invention.

FIG. 2 illustrates an example of a sense amplifier 20 in accordance with an aspect of the invention. The sense amplifier 20 can be configured substantially similar to the sense amplifier 14 in the example of FIG. 1, such that the sense amplifier 20 could be included in the memory system 10. Therefore, reference is to be made to the example of FIG. 1 in the following discussion of the example of FIG. 2. In addition, the following discussion of the example of FIG. 2 is directed to a read operation of the first flash transistor F1.

The sense amplifier 20 includes a current conveyor 22 and a sense latch 24. The current conveyor 22 is demonstrated in the example of FIG. 2 as being coupled to the bit-line nodes BLL and BLR. In the example of FIG. 2, a bit-line current $I_{BLL}$ is demonstrated as flowing to the current conveyor 22 from the first flash transistor F1. The magnitude of the bit-line current $I_{BLL}$ can be indicative of the memory value associated with the first flash transistor F1. As an example, a magnitude of the bit-line current $I_{BLL}$ being greater than a threshold can indicate one binary state of the memory value being read, while the magnitude of the bit-line current $I_{BLL}$ being less than the threshold can indicate another binary state of the memory value being read.

The current conveyor 22 is configured to regulate a plurality of currents, demonstrated in the example of FIG. 2 as a reference current $I_{REF}$ and a bias current $I_{BIAS}$. As an example, the reference current $I_{REF}$ can be a predetermined current having a magnitude that is approximately half of a current associated with an erased bit cell. Thus, the reference current $I_{REF}$ can be a predetermined threshold current that flows from the bit-line node BLL, such that opposite polarities of the difference of the bit-line current $I_{BLL}$ and the reference current $I_{REF}$ can indicate respective opposite binary states of the memory value being read. The current $I_{BIAS}$ can be a predetermined current that sinks current from the bit-line nodes BLL and BLR, such that the voltage magnitudes of the bit-line nodes BLL and BLR can remain substantially constant during the read operation. In addition, the current conveyor 22 is configured to generate a sense current $I_{SENSE}$ and a reference sense current $I_{SENSE\_REF}$ that flow from the sense latch 24 to the current conveyor 22. Specifically, the sense latch 24 can be configured to provide a positive rail voltage $V_{DD}$, and the current conveyor 22 can be configured to set a resistance to generate a current path for each of the currents $I_{SENSE}$ and $I_{SENSE\_REF}$.

The reference sense current $I_{SENSE\_REF}$ can have a magnitude that is predetermined. As an example, the reference sense current $I_{SENSE\_REF}$ can have a magnitude that is approximately equal to the reference current $I_{REF}$ and the bias current $I_{BIAS}$, such as to maintain a substantially constant voltage potential at the bit-line node BLR. However, the sense current $I_{SENSE}$ can have a magnitude that is based on a magnitude of the current $I_{BLL}$, such as to maintain a substantially constant voltage potential at the bit-line node BLL. As an example, the substantially constant voltage potential can be zero volts. Therefore, the sense current $I_{SENSE}$ has a magnitude that can vary directly with the magnitude of the current $I_{BLL}$. Accordingly, the sense latch 24 is configured to compare the sense current $I_{SENSE}$ with the reference sense current $I_{SENSE\_REF}$ to determine the memory value of the first flash transistor F1. In addition, because the voltage potential of the bit-line node BLL remains substantially constant (e.g., zero volts) during the read operation, the sense latch 24 can determine the memory value substantially rapidly in the absence of a build-up of charge at the bit-line node resulting from a parasitic capacitance. Furthermore, the current conveyor 22 can be configured as a cross-coupled device, such that the sense latch 24 can accurately determine the memory value of the first flash transistor F1, such as at magnitudes of the bit-line current $I_{BLL}$ that are approximately equal to the reference current $I_{REF}$.

Figure 3A:
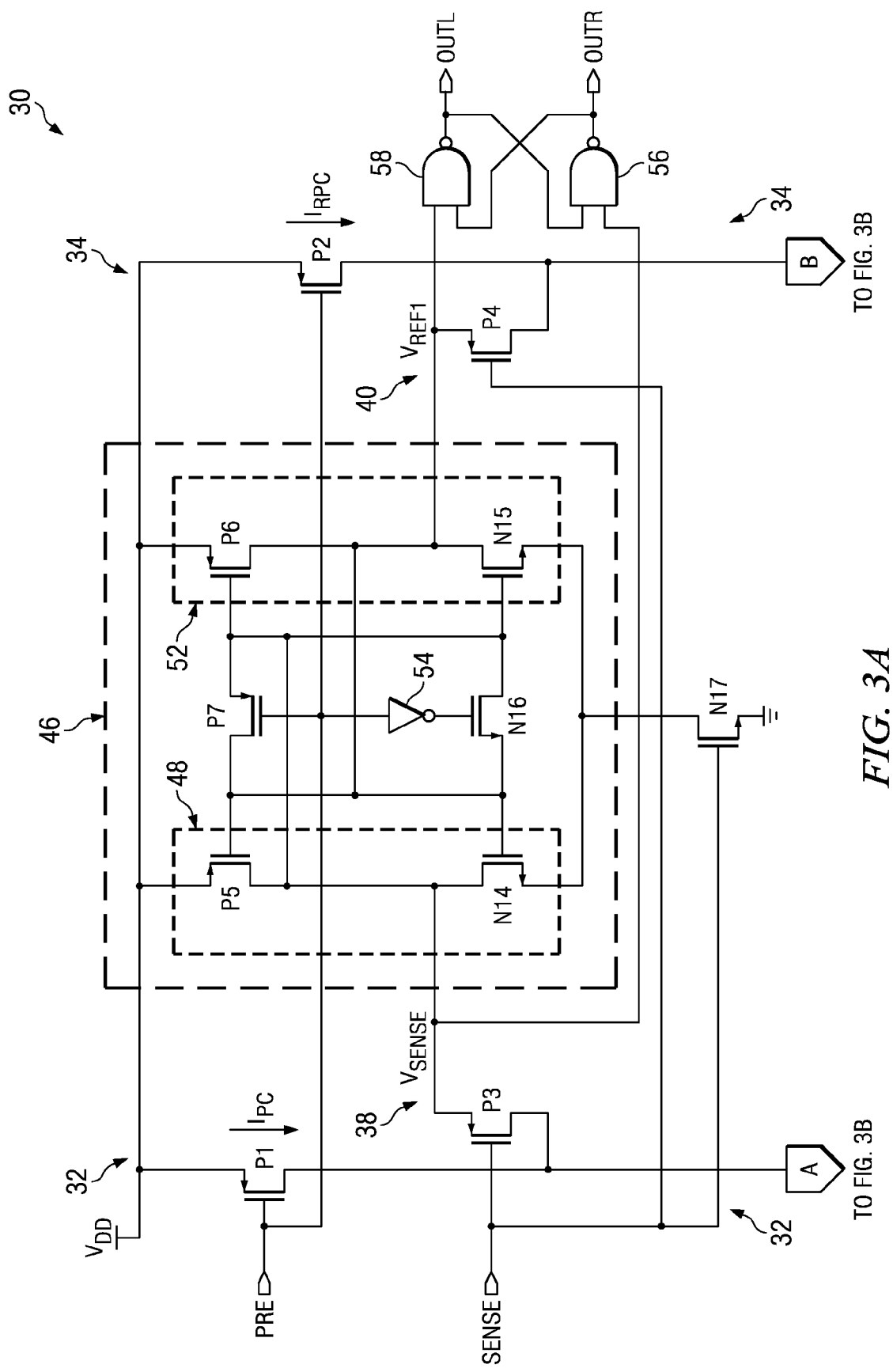
FIG. 3A illustrates an example of a sense latch in accordance with an aspect of the invention.
Figure 3B:
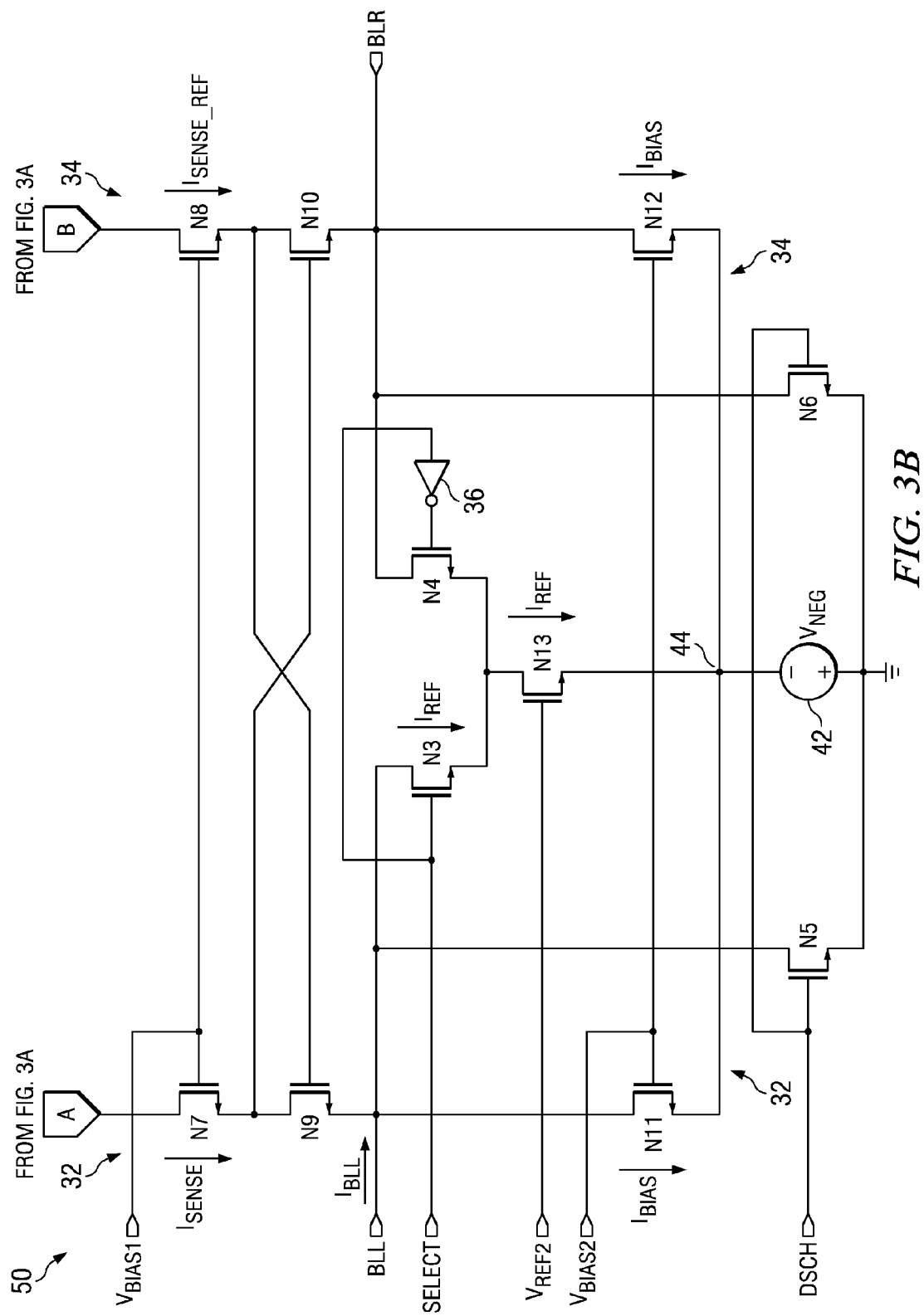
FIG. 3B illustrates an example of a current conveyor in accordance with an aspect of the invention.

FIG. 3A illustrates an example of a sense latch 30 in accordance with an aspect of the invention. FIG. 3B illustrates an example of a current conveyor 50 in accordance with an aspect of the invention. Therefore, the examples of FIGS. 3A and 3B, collectively described as FIG. 3 herein, demonstrate a sense amplifier, such as the sense amplifier 14 in the example of FIG. 1 or the sense amplifier 20 in the example of FIG. 2. Therefore, reference is to be made to the examples of FIGS. 1 and 2 in the following discussion of the examples of FIG. 3. The sense latch 30 in the example of FIG. 3A is demonstrated as being coupled to the current conveyor 50 at two separate nodes, demonstrated in the example of FIG. 3 at node "A" and node "B". Specifically, the node "A" in the sense latch 30 is coupled to the node "A" in the current conveyor 50, and the node "B" in the sense latch 30 is coupled to the node "B" in the current conveyor 50. In addition, similar to as described above in the example of FIG. 2, the following discussion of the examples of FIG. 3 is directed to a read operation of the first flash transistor F1. As such, in the example of FIG. 3A, the bit-line current $I_{BLL}$ is demonstrated at the bit-line node BLL.

In the example of FIG. 3, the sense latch 30 and the current conveyor 50 each include a sense portion 32 and a reference portion 34. The sense portion 32 is coupled to the bit-line node BLL corresponding to the first flash transistor F1 and the reference portion 34 is coupled to the bit-line node BLR corresponding to the second flash transistor F2. It is therefore to be understood that, in the examples of FIG. 3, the sense portion 32 and the reference portion 34 can be interchangeable depending on which of the first and second flash transistors F1 and F2 are being read. In the example of FIG. 3B, the current conveyor 50 is configured to receive a signal SELECT that corresponds to which of the first and second flash transistor F1 and F2 is selected to be read. The signal SELECT is provided to a gate of a transistor N3 and to a gate of a transistor N4 via an inverter 36, such that the transistors N3 and N4 are mutually exclusively activated. Thus, upon the signal SELECT being asserted (i.e., logic 1), the memory value of the first flash transistor F1 is selected to be read, and upon the signal SELECT being de-asserted (i.e., logic 0), the memory value of the second flash transistor F2 is selected to be read. In the following discussion of the example of FIG. 3, it is to be assumed that the signal SELECT is asserted, such that the memory value of the first flash transistor F1 is being read.

Figure 4:
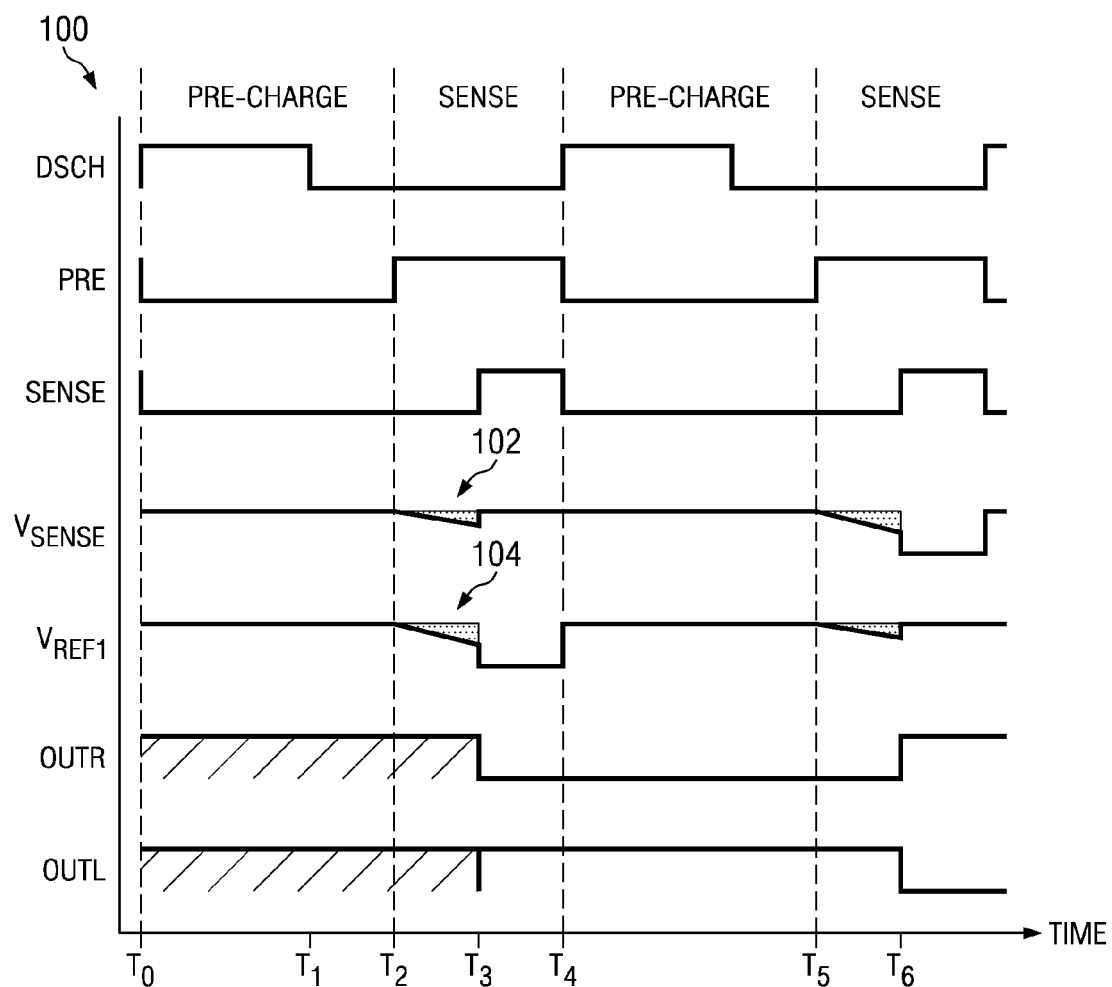
FIG. 4 illustrates an example of a timing diagram of a flash memory system in accordance with an aspect of the invention.

FIG. 4 illustrates an example of a timing diagram 100 of a read operation of a flash memory system that includes the sense latch 30 and the current conveyor 50 in accordance with an aspect of the invention. Therefore, reference is to be made to the examples of FIG. 3 in the following discussion of the example of FIG. 4.

At a time $T_0$, a pre-charge phase of the read operation begins, upon which a signal DSCH is asserted (i.e., logic-high) and two signals PRE and SENSE are each de-asserted (i.e., logic-low). As demonstrated in the example of FIG. 3B, the signal DSCH is provided to an N-type transistor N5 in the sense portion 32 and an N-type transistor N6 in the reference portion 34. The transistors N5 and N6 each interconnect the bit-line nodes BLL and BLR, respectively, and ground. Therefore, at the time $T_0$, the bit line nodes BLL and BLR are each coupled to ground based on the activation of the transistors N5 and N6 in response to the signal DSCH. Thus, in the example of FIG. 3A, the bit-line current $I_{BLL}$ is demonstrated as flowing from the first flash transistor F1 to ground.

As demonstrated in the example of FIG. 3A, the signal PRE is provided to gates of each of a P-type transistor P1 in the sense portion 32 and a P-type transistor P2 in the reference portion. Therefore, at the time $T_0$, the transistors P1 and P2 are activated to couple the positive voltage rail $V_{DD}$ to each of the sense portion 32 and the reference portion 34 via the respective transistors P1 and P2. As a result, a pre-charge current $I_{PC}$ and a reference pre-charge current $I_{RPC}$ flow through the transistors P1 and P2, respectively. In addition, the signal SENSE is provided to gates of a P-type transistor P3 that interconnects the sense portion 32 with a sense node 38 and a P-type transistor P4 that interconnects the reference portion 34 with a reference sense node 40. Thus, at the time $T_0$, the transistors P3 and P4 are each activated, such that a voltage $V_{SENSE}$ at the sense node 38 and a voltage $V_{REF1}$ at the reference node 40 are each approximately equal to the voltage $V_{DD}$.

In the example of FIG. 3B, the current conveyor 50 receives a predetermined voltage $V_{BIAS1}$. The voltage $V_{BIAS1}$ is coupled to respective gates of an N-type transistor N7 in the sense portion 32 and an N-type transistor N8 in the reference portion 34. The voltage $V_{BIAS1}$ has a magnitude that is set to activate the transistors N7 and N8, such as in the saturation mode of operation. In addition, the current conveyor 50 includes a pair of cross-coupled N-type transistors N9, located in the sense portion 32, and N10, located in the reference portion 34, such that the transistors N9 and N10 are likewise activated in the saturation mode. Therefore, the transistors N7 and N9 generate resistance to provide a path for a sense current $I_{SENSE}$ and the transistors N8 and N10 generate resistance to provide a path for a reference sense current $I_{SENSE\_REF}$. The sense current $I_{SENSE}$ flows from the positive rail voltage $V_{DD}$, through the transistors P1, N7, and N9 to ground at the bit-line node BLL, and the reference sense current $I_{SENSE\_REF}$ flows from the positive rail voltage $V_{DD}$, through the transistors P2, N8, and N10 to ground at the bit-line node BLR. Therefore, at the time $T_0$, the pre-charge current $I_{PC}$ through the transistor P1 is substantially the same as the sense current $I_{SENSE}$ and the reference pre-charge current $I_{RPC}$ through the transistor P2 is substantially the same as the sense current $I_{SENSE\_REF}$. It is to be understood that matching pairs of transistors in each of the sense portion 32 and the reference portion 34 can be electrically matched, such that they can operate substantially identically independent of temperature and process variations. As an example, each of the transistors N7, N8, N9, and N10 can all be substantially identical in size and manufacturing characteristics, such as based on being fabricated from a common wafer, such that each of the transistors N7, N8, N9, and N10 can provide a substantially equal resistance value in response to the voltage $V_{BIAS1}$.

Figure 5:
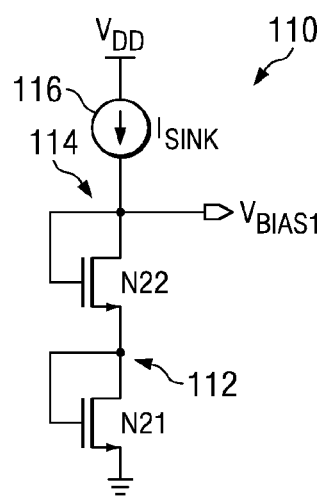
FIG. 5 illustrates an example of a circuit for generating a bias voltage in accordance with an aspect of the invention.

FIG. 5 illustrates an example of a circuit 110 for generating the bias voltage $V_{BIAS1}$ in accordance with an aspect of the invention. The bias voltage $V_{BIAS1}$ in the example of FIG. 5 is thus provided to the gates of the transistors N7 and N8. The circuit 110 includes a first N-type FET N21 having a source coupled to ground and having a gate and drain coupled together at a node 112. The circuit 110 also includes a second N-type FET N22 having a source coupled to the node 112 and having a gate and drain coupled together at an output 114 that provides the bias $V_{BIAS1}$. Furthermore, the circuit 110 includes a current source 116 that provides a bias current $I_{SINK}$, which can have a predetermined magnitude, from the positive rail voltage $V_{DD}$.

Based on the common gate/drain coupling, the transistors N21 and N22 are each diode-connected. In addition, the transistors N21 and N22 can be electrically matched with each other, as well as with the transistors N7, N8, N9, and N10. As a result, based on the matching of the transistors N7, N8, N9, and N10, the input resistance looking into the transistors N9 and N10 from the bit-line nodes BLL and BLR is approximately zero ohms. Thus, by controlling the magnitude of the current $I_{SINK}$ in providing the bias voltage $V_{BIAS1}$ via the matched transistors N21 and N22, the gain of the current conveyor 50 can likewise be controlled to provide stability in the sense current $I_{SENSE}$ and the reference sense current $I_{SENSE\_REF}$ based on the cross-coupling of the transistors N7, N8, N9, and N10. Accordingly, a comparison of the magnitudes of the sense current $I_{SENSE}$ and the reference sense current $I_{SENSE\_REF}$ by the sense latch 30, as described in greater detail below, can be performed with a high degree of accuracy.

Referring back to the example of FIG. 3B, the current conveyor 50 also includes a voltage supply 42 that is configured to generate a voltage $V_{NEG}$ at a node 44 that is negative relative to ground. The current conveyor 50 includes an N-type transistor N11 in the sense portion 32 and an N-type transistor N12 in the reference portion 34 that each have a gate that is controlled by a voltage $V_{BIAS2}$. The transistor N11 interconnects the bit-line node BLL and the node 44, and the transistor N12 interconnects the bit-line node BLR and the node 44. The transistors N11 and N12 can be electrically matched with respect to each other and can likewise operate in the saturation mode of operation based on the voltage $V_{VIAS2}$. Therefore, at the time $T_0$, the transistors N11 and N12 are configured to generate respective currents $I_{BIAS}$ having substantially equal magnitudes from the respective bit-line nodes BLL and BLR (i.e., ground) to the node 44.

Figure 6:
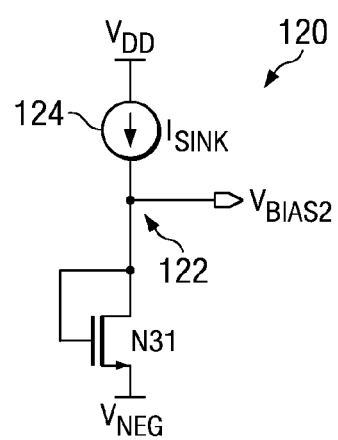
FIG. 6 illustrates another example of a circuit for generating a bias voltage in accordance with an aspect of the invention.

FIG. 6 illustrates an example of a circuit 120 for generating the bias voltage $V_{BIAS2}$ in accordance with an aspect of the invention. The bias voltage $V_{BIAS2}$ in the example of FIG. 6 is thus provided to the gates of the transistors N11 and N12. The circuit 120 includes an N-type FET N31 having a source coupled to the negative voltage $V_{NEG}$ and having a gate and drain coupled together at an output node 122 from which the bias voltage $V_{BIAS2}$ is provided. The circuit 120 also includes a current source 124 that, similar to the circuit 110 in the example of FIG. 5 above, also provides the bias current $I_{SINK}$ from the positive rail voltage $V_{DD}$.

Based on the common gate/drain coupling, the transistor N31 is diode-connected. In addition, the transistor N31 can be electrically matched with the transistors N11 and N12. As a result, the currents $I_{BIAS}$ in each of the sense portion 32 and reference portion 34 can be accurately generated based on the magnitude of the current $I_{SINK}$. Specifically, based on the matching of the transistor N31 to the transistors N11 and N12 in providing the voltage $V_{BIAS2}$ to the transistors N11 and N12, similar to the circuit 110 in the example of FIG. 5, the current $I_{SINK}$ is mirrored as the current $I_{BIAS}$ in the current conveyor 50. Therefore, during the pre-charge phase, the currents $I_{SENSE}$, $I_{SENSE\_REF}$, and $I_{BIAS}$ are all approximately equal to the predetermined current $I_{SINK}$.

In addition, the current conveyor 50 includes an N-type transistor N13 that interconnects the sources of the transistors N3 and N4 and the node 44. The transistor N13 has a gate that is provided a voltage $V_{REF2}$ to operate the transistor N13 in the saturation mode. Therefore, a current $I_{REF}$ flows from the bit-line node BLL (i.e., ground) through the transistor N3, which is activated via the signal SELECT as described above, and through the transistor N13 to the node 44. Accordingly, the currents $I_{BIAS}$ and the current $I_{REF}$ correspond to the currents $I_{BIAS}$ and $I_{REF}$ described in the example of FIG. 2 above, as the currents $I_{BIAS}$ and $I_{REF}$ operate to sink current from the bit-line node BLL.

Figure 7:
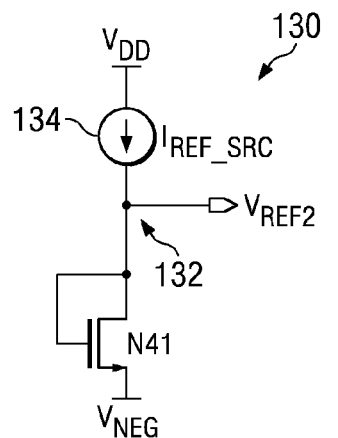
FIG. 7 illustrates an example of a circuit for generating a reference voltage in accordance with an aspect of the invention.

FIG. 7 illustrates an example of a circuit 130 for generating the reference voltage $V_{REF2}$ in accordance with an aspect of the invention. The reference voltage $V_{REF2}$ in the example of FIG. 7 is thus provided to the gate of the transistor N13. The circuit 130 includes an N-type FET N41 having a source coupled to the negative voltage $V_{NEG}$ and having a gate and drain coupled together at an output node 132 from which the reference voltage $V_{REF2}$ is provided. The circuit 130 also includes a current source 134 that provides a bias current $I_{REF\_SRC}$ from the positive rail voltage $V_{DD}$. The bias current $I_{REF\_SRC}$ can be a predetermined current that has a magnitude, for example, of approximately half of a current associated with an erased flash memory transistor. Based on the common gate/drain coupling, the transistor N41 is diode-connected, and can be electrically matched with the transistor N13. As a result, the reference current $I_{REF}$ through the transistor N13 can be accurately generated based on the magnitude of the current $I_{REF\_SRC}$ based on the current $I_{REF\_SRC}$ being mirrored from the circuit 130 into the current conveyor 50, similar to as described above regarding the circuits 110 and 120 in the examples of FIGS. 5 and 6, respectively.

Referring to FIG. 4, at a time $T_1$, the signal DSCH switches to a logic-low (i.e., logic 0) state. As a result, the transistors N5 and N6 are deactivated, thus decoupling the respective bit-line nodes BLL and BLR from ground. Therefore, in response to the decoupling of the bit-line nodes BLL and BLR from ground, the magnitudes of the currents associated with the respective bit-line nodes BLL and BLR are adjusted such that a substantially zero voltage magnitude is maintained at the respective bit-line nodes BLL and BLR. Specifically, the magnitudes of the currents associated with the bit-line node BLL can be approximately expressed as follows:

$$I_{SENSE} + I_{BLL} = I_{BIAS} + I_{REF} \qquad \text{Equation 1}$$

Likewise, the magnitudes of the currents associated with the bit-line node BLR can be approximately expressed as follows:

$$I_{SENSE\_REF} = I_{BIAS} \qquad \text{Equation 2}$$

Accordingly, a relationship between the sense current $I_{SENSE}$ and the reference sense current $I_{SENSE\_REF}$ can be derived by combining Equations 1 and 2 as follows:

$$I_{SENSE} - I_{SENSE\_REF} = I_{REF} - I_{BLL} \qquad \text{Equation 3}$$

Therefore, Equation 3 demonstrates that, based on the magnitudes of the reference sense current $I_{SENSE\_REF}$ and the current $I_{REF}$ being substantially constant, the sense current $I_{SENSE}$ has a magnitude that varies based on the magnitude of the bit-line current $I_{BLL}$. Accordingly, the functional relationship between the currents $I_{SENSE}$ and $I_{SENSE\_REF}$ and the currents $I_{REF}$ and $I_{BLL}$ can be indicative of the memory value stored in the first flash transistor F1, as demonstrated by Equation 3. Specifically, a comparison of the magnitude of the current $I_{BLL}$ relative to the reference current $I_{REF}$, as indicative of the memory value stored in the first flash transistor F1, can be determined based on a comparison of the magnitude of the sense current $I_{SENSE}$ relative to the magnitude of the reference sense current $I_{SENSE\_REF}$.

It is to be understood that, in the Equations 1-3, each of the bit-line nodes BLL and BLR may also include one or more additional currents, such as a small residual charging current associated with a parasitic capacitance of the respective bit-line nodes BLL and BLR. However, such additional currents have been omitted based on an assumption of balanced loading of the respective bit-line nodes BLL and BLR.

In the example of FIG. 3A, the sense latch 30 includes a cross-coupled latch circuit 46 that is interconnected between the sense node 38 and the reference node 40. The cross-coupled latch circuit 46 includes a P-type transistor P5 and an N-type transistor N14 that form a first inverter 48 having an input that is coupled to the reference node 40 and an output that is coupled to the sense node 38. Similarly, the cross-coupled latch circuit 46 includes a P-type transistor P6 and an N-type transistor N15 that form a second inverter 52 having an input that is coupled to the sense node 38 and an output that is coupled to the reference node 40. The cross-coupled latch circuit 46 also includes an N-type transistor N16 and a P-type transistor P7 that each interconnect the sense node 38 and the reference node 40. The signal PRE is provided to the gate of the transistor P7 and to the transistor N16 via an inverter 54, such that the transistors P7 and N16 operate as isolation transistors between the sense node 38 and the reference node 40. Accordingly, during the pre-charge phase of the read operation, at least one of the transistors P7 and N16 is activated to couple and thus equalize the sense node 38 and the reference node 40.

At a time $T_2$, the pre-charge phase of the read operation ends and a sensing phase of the read operation begins, upon which the signal PRE is asserted. In response, the transistors P1 and P2 become deactivated, thus removing the positive rail voltage $V_{DD}$ from the sense portion 32 and the reference portion 34 and deactivating the pre-charge current $I_{PC}$ and the reference pre-charge current $I_{RPC}$. As a result, the sense current $I_{SENSE}$ and the reference sense current $I_{SENSE\_REF}$ are no longer equivalent to the pre-charge current $I_{PC}$ and the reference pre-charge current $I_{RPC}$, as the voltage source for the sense current $I_{SENSE}$ and the reference sense current $I_{SENSE\_REF}$ is switched from the positive rail voltage $V_{DD}$ to the respective pre-charged sense node 38 and reference node 40. In addition, the isolation transistors P7 and N16 are also deactivated. Because the transistors N7, N8, N9, and N10 are biased in the saturation region, the sense current $I_{SENSE}$ and the reference sense current $I_{SENSE\_REF}$ remain substantially constant during the sensing phase. Thus, the sense node 38 and the reference node 40 begin to develop a voltage difference subsequent to the time $T_2$ that is based on the respective magnitudes of the sense current $I_{SENSE}$ and the reference sense current $I_{SENSE\_REF}$. It is to be understood that, although the transistors N7, N8, N9, and N10 are described as being electrically matched, process and/or temperature variations that could occur between the transistors N7, N8, N9, and N10 can be self-adjusted, and thus substantially cancelled, based on a sufficient duration of time provided between the times $T_1$ and $T_2$.

In the example of FIG. 4, the respective attenuation of the voltage $V_{SENSE}$ at the sense node 38 and the voltage $V_{REF1}$ at the reference node 40 is demonstrated by the shaded areas 102 and 104, respectively. The shaded areas 102 and 104 demonstrate that the voltage $V_{REF1}$ decreases more rapidly than the voltage $V_{SENSE}$, thus indicating that the reference sense current $I_{SENSE\_REF}$ has a magnitude that is greater than the sense current $I_{SENSE}$. Accordingly, because the magnitude of the sense current $I_{SENSE}$ is based on the magnitude of the bit-line current $I_{BLL}$, it is demonstrated that the bit-line current $I_{BLL}$ has a magnitude that is greater than the current $I_{REF}$, as demonstrated based on Equation 3. As such, the magnitude of the reference sense current $I_{SENSE\_REF}$ being greater than the magnitude of the sense current $I_{SENSE}$ can indicate the memory value that is stored within the first flash transistor F1.

The sense latch 30 includes an N-type transistor N17 that is controlled by the signal SENSE and interconnects the cross-coupled latch circuit 46 and ground. The sense latch 30 also includes a pair of cross-coupled logic NAND-gates 56 and 58. The NAND-gate 56 provides an output signal OUTR that corresponds to a binary state of the memory value of the second flash transistor F2 and the NAND-gate 58 provides an output signal OUTL that corresponds to a binary state of the memory value of the first flash transistor F1. The cross-coupling of the NAND-gates 56 and 58 is such that the NAND-gate 58 receives both the reference voltage $V_{REF1}$ and the output signal OUTR as inputs and the NAND-gate 56 receives both the sense voltage $V_{REF1}$ and the output signal OUTL as inputs. Therefore, the NAND-gates 56 and 58 provide the output signals OUTR and OUTL, respectively, mutually exclusively based on respective logic states of the sense voltage $V_{SENSE}$ and the reference voltage $V_{REF1}$.

At a time $T_3$, the signal SENSE switches to a logic high (i.e., logic 1) state. As a result, the transistors P3 and P4 are deactivated, thus isolating the sense node 38 and the reference node 40 from the sense portion 32 and the reference portion 34. As a result, loading of the sense node 38 and the reference node 40 is reduced to provide for rapid switching of the cross-coupled latch circuit 46. In addition, the transistor N17 is activated to couple the cross-coupled latch circuit 46 to ground. As a result, the inverters 48 and 52 can operate in conjunction with each other to force the respective sense voltage $V_{SENSE}$ and the reference voltage $V_{REF1}$ to opposing binary logic states. Specifically, upon activation of the transistor N17, the inverters 48 and 52 are configured to compare the magnitudes of the voltages $V_{SENSE}$ and $V_{REF1}$. Whichever of the voltages $V_{SENSE}$ and $V_{REF1}$ has the higher voltage potential is pulled-up to the positive rail voltage $V_{DD}$, while the other of the voltages $V_{SENSE}$ and $V_{REF1}$ that has the lower voltage potential is pulled-down to ground. As a result, the respective one of the NAND-gates 56 and 58 can provide a respective output that can correspond to the memory value of the one of the second and first flash transistor F2 and F1 that is being read.

In the example of FIG. 4, at the time $T_3$, the timing diagram 100 demonstrates that the sense voltage $V_{SENSE}$ is forced to a logic-high value while the reference voltage $V_{REF1}$ is forced to a logic-low value. Thus, the NAND-gate 58 switches to a logic-high state to provide a binary "1" value of the output signal OUTL, thus corresponding to the memory value of the first flash transistor F1 based on a magnitude of the bit-line current $I_{BLL}$. The timing diagram 100 also demonstrates a second read operation beginning at a time $T_4$, at which another pre-charge phase is initiated. The sense latch 30 and the current conveyor 50 thus operate again as described above. At a time $T_5$, another sense phase is initiated, at which the magnitudes of the sense voltage $V_{SENSE}$ and the reference voltage $V_{REF1}$ decrease, respectively, in an opposite manner as that occurring at the time $T_2$. Therefore, during the second read operation beginning at the time $T_4$, the reference sense current $I_{SENSE\_REF}$ has a lesser magnitude than the sense current $I_{SENSE}$. As a result, at a time $T_6$, the output signals OUTL and OUTR switch states to demonstrate that the first flash transistor F1 has an opposite memory value than that demonstrated at the time $T_3$.

As demonstrated in the examples of FIGS. 3 and 4, it is described that the memory value of the first flash transistor F1 can be read by maintaining a substantially constant, zero voltage at the bit-line node BLL. As a result, because there is substantially no voltage swing at the bit-line node BLL, the memory value can be read substantially more rapidly than a typical flash memory transistor. It is to be understood that the memory system 10, the sense amplifier 20, the sense latch 30, and the current conveyor 50 are not intended to be limited to the examples of FIGS. 1-3. Specifically, other circuit designs can be implemented to provide a system that reads a memory value from a flash memory transistor while maintaining the substantially constant voltage potential at the bit-line node. Accordingly, it is to be understood that the memory system 10, the sense amplifier 20, the sense latch 30, and the current conveyor 50 can be configured in any of a variety of ways. In addition, in the example of FIG. 4, the timing diagram 100 is demonstrated as an ideal timing diagram. Therefore, it is to be understood that certain delays and variations in magnitude that may be inherent to an actual flash memory system are not demonstrated in the example of FIG. 4 for the sake of simplicity.

Figure 8:
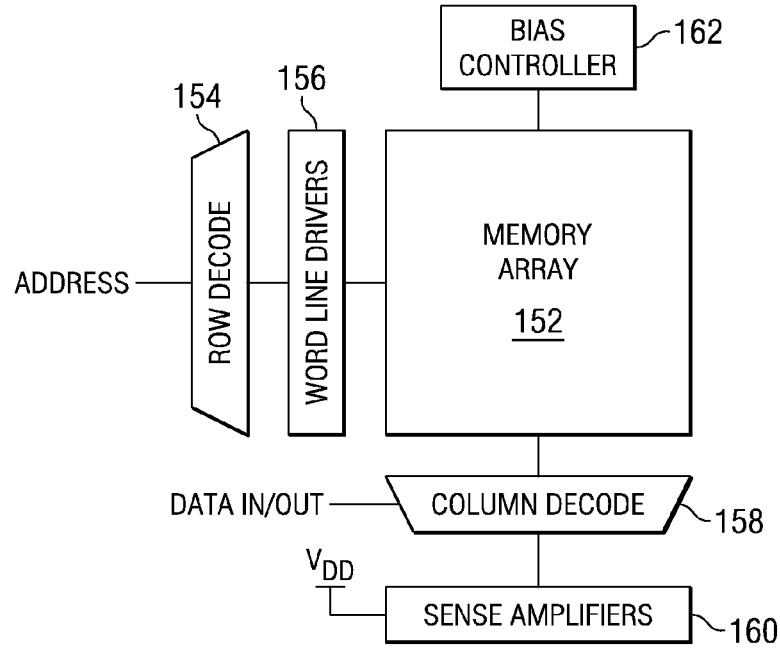
FIG. 8 illustrates an example of a block diagram depicting a memory array system in accordance with an aspect of the invention.

FIG. 8 illustrates an example of a block diagram depicting a memory array system 150 in accordance with an aspect of the invention. The memory array system 150 can be formed as an integrated circuit. The memory array system 150 includes a memory array 152 and peripheral circuitry for reading and writing to memory cells of the memory array 152. As an example, the memory array 152 can be a flash memory array. However, it is to be understood that the memory array 152 can be configured to implement any of a variety of memory types.

The memory array system 150 includes row decode circuitry 154 and word line drivers 156 coupled to the memory cells of the memory array 152 via at least one corresponding write word line and at least one corresponding read word line. The memory array system 150 also includes column decode circuitry 158 and sense amplifiers 160 connected to the memory cells via at least one write bit line and at least one read bit line. Therefore, selected portions of the memory array 152 can be accessed for reading data from or writing data to the memory cells within the memory array 152.

As an example, during a read operation, the memory array system 150 can enter a pre-charge phase during which the positive rail voltage $V_{DD}$ is provided to the sense and reference portions of sense latches and current conveyors of the sense amplifiers 160 of the selected portion of cells of the memory array 152. Therefore, the currents associated with the respective bit-line nodes can be regulated. A bias controller 162 can provide a bias voltage to the selected portion of cells of the memory array 152, such that a bit-line current can be provided, such as from flash transistors. Subsequent to the pre-charge phase, the memory array system 150 can enter a sense phase, at which the sense amplifiers 160 can determine the memory values of the selected portion of cells of the memory array 152 based on the magnitudes of the bit-line currents. For example, the magnitude of a sense current that varies based on the bit-line current can be compared with a reference sense current to determine the memory value, similar to as described above in the examples of FIGS. 1-4. Accordingly, the memory values of the selected portion of cells of the memory array 152 can be determined substantially concurrently, such as similar to the manner described above in the examples of FIGS. 1-4.

Figure 9:
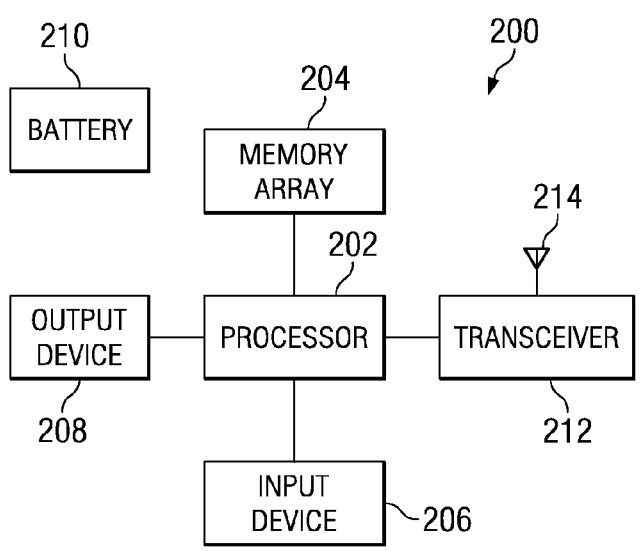
FIG. 9 illustrates an example of a portable electronic device employing a memory array system in accordance with an aspect of the invention.

It is to be appreciated that a memory array system 150 can be employed in a variety of different applications. FIG. 9 illustrates an example of a portable electronic device 200 employing a memory array system in accordance with an aspect of the invention. The portable electronic device 200 includes a processor 202 coupled to a memory array system 204, such as can be similar to the memory array system 150 described in the example of FIG. 8 above. The portable electronic device 200 also includes an input device 206 (e.g., keyboard, keypad, touch screen) and an output device 208 (e.g., display, printer, peripheral device) both coupled to the processor 202, and a battery 210 for powering the components of the portable electronic device 200. The portable electronic device 200 may include a transceiver 212 and an antenna 214 for wireless transmission with one or more other devices.

Figure 10:
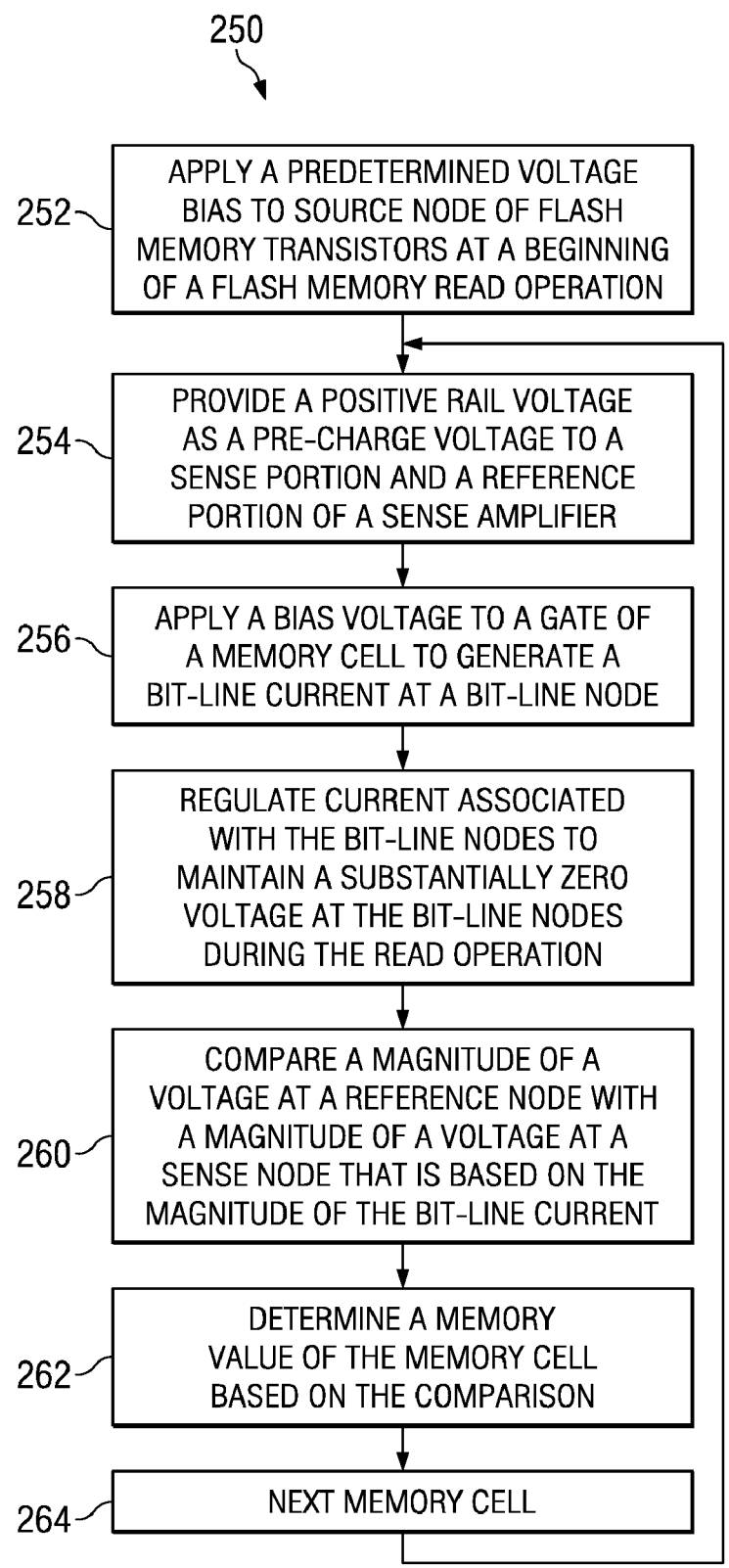
FIG. 10 illustrates an example of a method for reading memory in accordance with an aspect of the invention.

In view of the foregoing structural and functional features described above, certain methods will be better appreciated with reference to FIG. 10. It is to be understood and appreciated that the illustrated actions, in other embodiments, may occur in different orders and/or concurrently with other actions. Moreover, not all illustrated features may be required to implement a method.

FIG. 10 illustrates an example of a method 250 for reading memory in accordance with an aspect of the invention. The memory being read can be a flash memory, or can be any of a variety of other types of memories. At 252, a predetermined voltage bias is applied to source nodes of flash memory transistors at a beginning of a flash memory read operation. The flash memory transistors can be included in a flash memory array, such that the source nodes of each the flash memory transistors in the flash memory array can be coupled together. At 254, a positive rail voltage is provided as a pre-charge voltage to a sense portion and a reference portion of a sense amplifier. The pre-charge voltage can be provided to the respective portions via transistors in a pre-charge phase of the read operation. The pre-charge voltage can also be provided to a sense node and a reference node via additional transistors.

At 256, a bias voltage is applied to a gate of a memory cell to generate a bit-line current at a bit-line node. The memory cell can include a single flash memory transistor of the flash memory array. The magnitude of the bit-line current flowing from the flash memory common source to the decoded drain of a flash memory transistor can be based on the memory value stored therein. At 258, currents associated with the bit-line nodes are regulated to maintain a substantially zero voltage magnitude at the bit-line nodes throughout a pre-charge phase and a sense phase of the read operation of the flash memory transistor. The bit-line nodes can include a bit-line node that corresponds to the memory cell being sensed and a bit-line node that is used as a reference. The bit-line nodes can be initially grounded to set the currents. At least one of the additional currents can result from a power supply that generates a negative voltage relative to ground to draw current from the bit-line nodes. Thus, the magnitude of all of the currents entering the bit-line nodes can be substantially equal to the magnitude of all of the currents leaving the bit-line nodes to maintain the zero magnitude.

At 260, a magnitude of a voltage at a reference node is compared with a magnitude of a voltage at a sense node that is based on the magnitude of the bit-line current. One of the additional currents can have a magnitude that is based on the bit-line current, and the magnitude of the voltage of the sense node can be based on the magnitude of the additional current. The voltage of the reference node can be based on a magnitude of a predetermined reference current. At 262, a memory value of the flash memory transistor is determined based on the comparison. The sense node and the reference node can be interconnected by a cross-coupled latch that is configured to force a logic state of the nodes based on their relative magnitudes. The forced logic state can correspond to the memory value or an inversion of the memory value. At 264, the method returns to 254 for the reading of the memory value of a next memory cell.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A memory system comprising:
a memory cell coupled to a bit-line node, the memory cell being configured to generate a bit-line current on the bit-line node in response to a bias voltage during a read operation; and
a sense amplifier configured to maintain a substantially zero voltage magnitude of the bit-line node based on regulating current flow to and from the bit-line node, and to determine a memory value of the flash memory transistor during the read operation based on a magnitude of the bit-line current on the bit-line node.

2. A memory system comprising:
a memory cell coupled to a bit-line node, the memory cell being configured to generate a bit-line current on the bit-line node in response to a bias voltage during a read operation; and
a sense amplifier configured to maintain a substantially zero voltage magnitude of the bit-line node based on regulating current flow to and from the bit-line node, and to determine a memory value of the flash memory transistor during the read operation based on a magnitude of the bit-line current on the bit-line node,
wherein the sense amplifier comprises a current conveyor and a sense latch, the current conveyor being configured to regulate a plurality of additional currents constituting the current flow to and from the bit-line node and the sense latch being configured to determine the memory value of the memory cell based on a relative magnitude of the bit-line current and the plurality of additional currents.

3. The system of claim 2, wherein the plurality of additional currents comprises a sense current and a reference sense current, the sense current having a magnitude that varies based on the bit-line current, the memory value of the memory cell being determined based on a relative magnitude between the sense current and the reference sense current.

4. The system of claim 3, wherein each of the plurality of additional currents are generated via a respective plurality of bias circuits that mirror the plurality of additional currents in the current conveyor, the plurality of bias circuits each comprising transistors that are configured substantially identical to corresponding transistors in the current conveyor through which the plurality of additional currents flow.

5. The system of claim 3, wherein the sense latch is configured to switch a voltage source for each of the sense current and the reference sense current from a positive voltage rail during the pre-charge phase of the read operation to a respective sense node and a respective reference node during the sense phase of the read operation.

6. The system of claim 5, wherein the sense latch comprises a cross-coupled latch that interconnects the sense node and the reference node, the cross-coupled latch being configured to set an output corresponding to the memory value of the memory cell based on a relative change in voltage magnitudes of the sense node and the reference node during the sense phase in response to the relative magnitude between the sense current and the reference sense current.

7. The system of claim 3, wherein the plurality of additional currents comprises at least one predetermined current that flows from the bit-line node to maintain the substantially constant voltage magnitude of the bit-line node during both the pre-charge phase and the sense phase of the read operation.

8. The system of claim 1, wherein the memory cell is a first memory cell having a drain coupled to the bit-line node and a source coupled to the bias voltage, and wherein the bit-line node is a first bit-line node, the system further comprising a second memory cell having a drain coupled to a second bit-line node and a source that is coupled to the bias voltage, wherein the sense amplifier is configured to receive at least one selection signal to select between the first memory cell and the second memory cell for the determination of the memory value during the read operation.

9. The system of claim 8, wherein the sense latch is configured to generate a sense current flowing into one of the first and second bit-line nodes and a reference sense current flowing into the other of the first and second bit-line nodes in response to the at least one selection signal, the sense current having a magnitude that varies based on the current associated with the one of the first and second bit-line nodes, the memory value of the respective one of the first and second memory cells being determined based on a relative magnitude between the sense current and the reference sense current.

10. The system of claim 1, wherein the memory cell comprises a flash memory transistor.

11. A memory array system comprising the memory system of claim 1.

12. A portable electronic device comprising the memory array system of claim 11, and further comprising:
   a processor coupled to the memory array;
   an input device coupled to the processor;
   an output device coupled to the processor; and
   a battery configured to provide power to at least one of the processor, the input device, the output device and the memory array.

13. The portable electronic device of claim 12, further comprising:
   a transceiver coupled to the processor; and
   an antenna coupled to the transceiver.

14. A method for reading a memory cell, the method comprising:
   applying a bias voltage to a gate of the memory cell to generate a bit-line current on a bit-line node;
   regulating current flow into and out of the bit-line node to maintain a substantially zero voltage at the bit-line node during a pre-charge phase and a sense phase of a read operation of the memory cell; and
   determining a memory value of the memory cell during the sense phase of the read operation based on a magnitude of the bit-line current.

15. A method for reading a memory cell, the method comprising:
   applying a bias voltage to a gate of the memory cell to generate a bit-line current on a bit-line node;
   regulating current flow into and out of the bit-line node to maintain a substantially constant voltage at the bit-line node during a pre-charge phase and a sense phase of a read operation of the memory cell; and
   determining a memory value of the memory cell during the sense phase of the read operation based on a magnitude of the bit-line current,
   wherein regulating the current flow comprises regulating a sense current having a magnitude that varies based on the bit-line current, the method further comprising generating a reference sense current, the memory value of the memory cell being determined based on a relative magnitude between the sense current and the reference sense current.

16. The method of claim 15, further comprising:
   switching a voltage source for each of the sense current and the reference sense current from a positive voltage rail during the pre-charge phase of the read operation to a respective sense node and a respective reference node during the sense phase of the read operation; and
   determining the memory value of the memory cell based on a relative change in voltage magnitudes of the sense node and the reference node during the sense phase in response to the relative magnitude between the sense current and the reference sense current based on a relative magnitude between the bit-line current and the reference sense current.

17. The method of claim 14, wherein regulating the current flow comprises regulating at least one predetermined current that flows from the bit-line node and a sense current that flows to the bit-line node, the at least one predetermined current having a sum of magnitudes that is approximately equal to a sum of magnitudes of the sense current and the bit-line current.

18. The method of claim 17, wherein regulating the at least one predetermined current comprises regulating a predetermined threshold current, and wherein determining the memory value comprises determining the memory value of the memory cell during the sense phase of the read operation based on a magnitude of the sense current relative to a magnitude of the predetermined threshold current.

19. The method of claim 17, further comprising:
   pre-charging a sense node and a reference node with a positive supply voltage; and
   generating a first voltage potential at the sense node in response to the sense current; and
   generating a second voltage potential at the reference node, the memory value of the memory cell being determined based on a relative magnitude between the sense current and the reference sense current.

20. The method of claim 19, further comprising:
   isolating the sense node and the reference node from the positive supply voltage; and
   determining the memory value of the memory cell based on a relative change in the first and second voltage potentials in response to the relative magnitude between the sense current and the reference sense current.

21. A system for implementing a read operation for reading data from a plurality of memory cells, the system comprising:
   means for pre-charging a sense node and a reference node associated with each of the memory cells;
   means for applying a bias voltage to each of the memory cells to induce a bit-line current associated with a respective bit-line node of each of the memory cells in response to the applied bias voltage;
   means for generating a sense current and a reference sense current for each of the memory cells, the reference sense current having a predetermined magnitude and the sense current having a magnitude that varies as a function of the respective bit-line current; and
   means for determining a memory value of each of the memory cells based on a relative change in voltage magnitudes of the respective sense node and the respective reference node in response to the relative magnitude between the respective sense current and the respective reference sense current, and
   means for regulating a predetermined current that flows from the respective bit-line node of each of the memory cells to maintain a voltage magnitude at the respective bit-line node of approximately zero during both a pre-charge phase and a sense phase of the read operation.

* * * * *